United States Patent
Park et al.

(10) Patent No.: US 9,214,286 B2
(45) Date of Patent: Dec. 15, 2015

(54) DYE-SENSITIZED SOLAR CELL AND PREPARING METHOD OF THE SAME

(71) Applicant: RESEARCH & BUSINESS FOUNDATION SUNGKYUNKWAN UNIVERSITY, Suwon-si (KR)

(72) Inventors: Nam-Gyu Park, Seoul (KR); Jin-Wook Lee, Yeongyang-gun (KR); Dae-Yong Son, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 13/962,073

(22) Filed: Aug. 8, 2013

(65) Prior Publication Data

US 2014/0041726 A1 Feb. 13, 2014

(30) Foreign Application Priority Data

Aug. 8, 2012 (KR) .................... 10-2012-0086639

(51) Int. Cl.
*H01L 31/0336* (2006.01)
*H01G 9/20* (2006.01)

(52) U.S. Cl.
CPC .............. *H01G 9/20* (2013.01); *H01G 9/2031* (2013.01); *H01L 2251/301* (2013.01); *Y02E 10/542* (2013.01)

(58) Field of Classification Search
CPC .. H01G 9/2045; H01G 9/2054; H01G 9/2022
USPC ............................................ 136/263; 438/82
See application file for complete search history.

(56) References Cited

U.S. PATENT DOCUMENTS

| 5,350,644 | A | 9/1994 | Graetzel et al. | |
|---|---|---|---|---|
| 8,801,979 | B2 * | 8/2014 | Chang et al. | 264/11 |
| 2007/0084507 | A1 * | 4/2007 | Noh et al. | 136/263 |
| 2011/0303269 | A1 * | 12/2011 | Kim et al. | 136/255 |
| 2012/0085410 | A1 * | 4/2012 | Wang et al. | 136/260 |
| 2013/0186465 | A1 * | 7/2013 | Zhou et al. | 136/256 |

FOREIGN PATENT DOCUMENTS

| KR | 10-0578798 | | 6/2005 |
|---|---|---|---|
| KR | 10-1117689 | B1 | 2/2012 |
| WO | WO 2012/040894 | * | 5/2012 |

OTHER PUBLICATIONS

Lei et al., Recent Progress in the Fields of Tuning the Band Bap of Quantum Dots, Science China: Technological Sciences, vol. 55, pp. 903-912, Apr. 2012.*
Mulmudi et al., Solution Processed Transition Metal Sulfides: Application as Counter Electrodes in Dye-Sensitized Solar Cells, Phys Chem Chem Phys, vol./Issue 13, pp. 19307-19309 (2011).*
Mori et al., Organi Solvent Based TiO2 Dispersion Paste for Dye-Sensitized Solar Cells Prepared by Industrial Production Level Procedure, JOurnal of Material Science, pp. 1-10 (2010).*
Lee et al., Quantum-Dot-Sensitized Soalr Cell with Unprecedentedly High Photocurrent, Scientific Reports, vol./Issue 3:1050, pp. 1-8 (2013).*

* cited by examiner

*Primary Examiner* — Jayne Mershon
(74) *Attorney, Agent, or Firm* — NSIP Law

(57) ABSTRACT

A dye-sensitized solar cell including an inorganic dye containing all of Pb, Hg and S as a photo-sensitive dye and a manufacturing method of the same are provided.

17 Claims, 5 Drawing Sheets

DYE-SENSITIZED SOLAR CELL AND PREPARING METHOD OF THE SAME

CROSS-REFERENCE TO RELATED APPLICATION

This application claims the benefit of Korean Patent Application No. 10-2012-0086639 filed on Aug. 8, 2012, the disclosures of which are incorporated herein by reference.

FIELD OF THE INVENTION

The present disclosure relates to a dye-sensitized solar cell including an inorganic dye containing all of Pb, Hg and S as a photo-sensitive dye, and a manufacturing method of the same.

BACKGROUND OF THE INVENTION

In general, a solar cell is a device that converts light energy of the sun into electric energy. That is, the solar cell is a device that produces electricity using sunlight which is an infinite energy source. A silicon solar cell, one kind of such solar cell, is already widely used in daily life. Recently, a dye-sensitized solar cell is attracting attention as a next-generation solar cell. The dye-sensitized solar cell is a photo-electrochemical solar cell having higher efficiency and much lower manufacturing cost per unit, as compared to the conventional silicon solar cell. Thus, the dye-sensitized solar cell is expected to replace the conventional silicon solar cell.

One representative example of such a dye-sensitized solar cell is one developed by Michael Gratzel's research team of EPFL (Ecole Polytechnique Federale de Lausanne, Switzerland) in 1991 (see, for reference, U.S. Pat. No. 5,350,644, "Photovoltaic Cells"). In the structural aspect, one of two electrodes of the dye-sensitized solar cell is a photoelectrode including a transparent conductive substrate forming thereon a semiconductor layer on which a photosensitive dye is adsorbed. Electrolyte is filled in a space between the two electrodes.

A basic principle of the operation of the dye-sensitized solar cell is as follows. As solar energy is absorbed by the photosensitive dye adsorbed onto the semiconductor layer of the one electrode, and thus photoelectrons are generated. The photoelectrons are transferred to the transparent conductive substrate on which a transparent electrode is formed by conducting through the semiconductor. The dye oxidized as a result of losing the electrons is reduced by redox pairs included in the electrolyte. Meanwhile, electrons that reach the counter electrode on the opposite side through an external electric line reduce the redox pairs of the oxidized electrolyte. In this way, the solar cell is operated.

Meanwhile, as compared to a conventional solar cell, the dye-sensitized solar cell has many interfaces such as a semiconductor/dye interface, a semiconductor/electrolyte interface, a semiconductor/transparent electrode interface, an electrolyte/counter electrode interface, and so on. Understanding and controlling physical and chemical reactions that take place at these interfaces is the key issue of the dye-sensitized solar cell technique. Further, energy conversion efficiency is in proportion to the amount of the photoelectrons generated by the absorption of the solar energy. In order to generate a great amount of photoelectrons, it is required to fabricate a photoelectrode including a structure capable of increasing an adsorption amount of dye molecules.

In general, a ruthenium (Ru) metal complex has been widely used as a dye for the dye-sensitized solar cell. For example, Korean Registered Patent No. 10-0578798 ("Dye-sensitized solar cell and method of manufacturing the same") describes a dye-sensitized solar cell including ruthenium as a photosensitive dye. However, the ruthenium metal complex has drawbacks in that it is very expensive and difficult to purification. Further, it takes a long time ranging from a minimum of 2 hours to a maximum of 24 hours to adsorb an organic dye containing ruthenium metal onto the semiconductor layer. As a result, it takes a long time to complete the manufacture of the dye-sensitized solar cell. Further, since the organic dye containing the ruthenium metal cannot absorb light having a wavelength equal to or lager than about 800 nm, it is impossible to utilize light in a long wavelength range. Thus, there exists a limit in improving photoelectric current.

BRIEF SUMMARY OF THE INVENTION

The present inventors has reached the present disclosure by finding out that many advantages such as improvement of the efficiency of the dye-sensitized solar cell due to the expansion of absorption wavelength, reduction of the time taken for the manufacture of the solar cell and reduction of the manufacturing cost can be expected by manufacturing a dye containing all of Pb, Hg and S and applying to a dye-sensitized solar cell.

In view of the foregoing, the present disclosure provides a dye-sensitized solar cell, including: a first electrode including a light-absorbing layer formed on a transparent conductive substrate; a second electrode facing the first electrode; and an electrolyte provided between the first electrode and the second electrode, wherein the light-absorbing layer includes a semiconductor layer, and a dye represented by the following Chemical Formula 1 and a method for manufacturing the dye-sensitized solar cell:

   [Chemical Formula 1]

wherein in Chemical Formula 1, x denotes a value from more than about 0 to less than about 1.

However, the problems sought to be solved by the present disclosure are not limited to the above description and other problems can be clearly understood by those skilled in the art from the following description.

In accordance with a first aspect of the present disclosure, there is provided a dye-sensitized solar cell, including: a first electrode including a light-absorbing layer formed on a transparent conductive substrate; a second electrode facing the first electrode; and an electrolyte provided between the first electrode and the second electrode, wherein the light-absorbing layer includes a semiconductor layer, and a dye represented by the following Chemical Formula 1:

   [Chemical Formula 1]

wherein in Chemical Formula 1, x denotes a value from more than about 0 to less than about 1.

In accordance with a second aspect of the present disclosure, there is provided a method for manufacturing a dye-sensitized solar cell as the first aspect of the present disclosure, the method including: forming a semiconductor layer on a transparent conductive substrate; forming a light-absorbing layer by adsorbing a dye represented by the following Chemical Formula 1 onto the semiconductor layer to thereby form a first electrode including the light-absorbing layer formed on the transparent conductive substrate; assembling the first electrode and a second electrode such that the first electrode and the second electrode face to each other; and injecting electrolyte between the first electrode and the second electrode:

$$Pb_{1-x}Hg_xS;$$ [Chemical Formula 1]

wherein in Chemical Formula 1, x denotes a value from more than about 0 to less than about 1.

Unlike a conventional dye-sensitized solar cell, the dye-sensitized solar cell in accordance with the present disclosure uses the inorganic dye containing all of Pb, Hg and S, not an organic dye including a ruthenium metal complex. Thus, problems that have been caused by the dye in the conventional dye-sensitized solar cell can be solved.

The conventional dye-sensitized solar cell generally uses the organic dye containing the ruthenium metal complex as a photosensitive dye. In such a case, however, a light absorption wavelength range is limited to equal to or less than about 800 nm, and light in a long wavelength range cannot be utilized. Thus, there has been a limit in improving photocurrent. Furthermore, the organic dye containing the ruthenium metal complex has a problem of high price due to a high price of ruthenium metal raw material. Moreover, the organic dye containing the ruthenium metal complex is adsorbed in a surface of a metal oxide, thus forming a light-absorbing layer of the dye-sensitized solar cell. The adsorption process, however, takes a minimum of about 2 hours to a maximum of about 24 hours. Thus, it has been difficult to shorten the manufacturing process, resulting in an increase of a manufacturing cost per unit.

In contrast, when using the dye represented by Chemical Formula 1 of the present disclosure instead of the organic dye containing the ruthenium metal complex, it becomes possible to absorb light in a wider wavelength range, e.g., in a long wavelength range of about 1,400 nm. Accordingly, very high photocurrent can be generated. Ultimately, efficiency of the dye-sensitized solar cell can be ameliorated.

In addition, the dye-sensitized solar cell including the compound represented by Chemical Formula 1 of the illustrative embodiment as a photosensitive dye has an advantage in that a dye adsorption process in the course of manufacturing the solar cell can be readily performed at a room temperature in a short period of time. Thus, the dye-sensitized solar cell of the present disclosure can be manufactured relatively easily at a low cost, and the time taken for the manufacturing process can also be reduced. Thus, the dye-sensitized solar cell in accordance with the present disclosure is advantageous in the aspect of time and cost.

Further, in the dye-sensitized solar cell of the present disclosure, by adjusting relative contents of Pb, Hg and S contained in the dye represented by Chemical Formula 1, energy conversion efficiency can also be improved. By adjusting a thickness of the semiconductor layer onto which the dye is adsorbed, the energy conversion efficiency can also be adjusted. Further, the semiconductor layer onto which the dye is adsorbed is formed by laminating nanoparticles of various sizes. Accordingly, it may be possible to maximize the surface area onto which the dye can be adsorbed, so that the energy conversion efficiency can be further improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
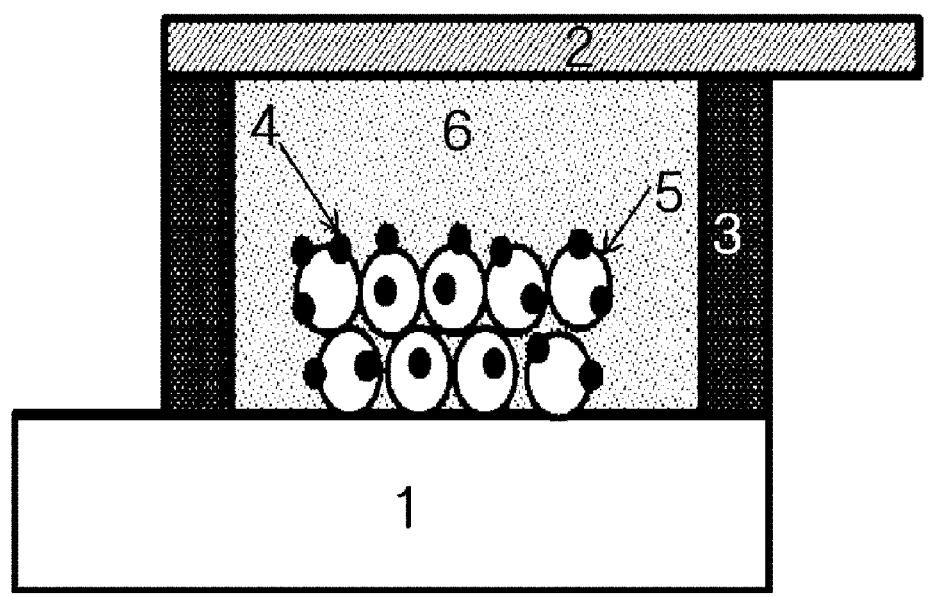
FIG. 1 is a schematic diagram illustrating a layer structure of a dye-sensitized solar cell in accordance with an illustrative embodiment of the present disclosure.

Hereinafter, illustrative embodiments and examples will be described in detail so that inventive concept may be readily implemented by those skilled in the art. However, it is to be noted that the present disclosure is not limited to the illustrative embodiments and examples but can be realized in various other ways. In drawings, parts not directly irrelevant to the description are omitted to enhance the clarity of the drawings, and like reference numerals denote like parts through the whole document.

Through the whole document, the terms "connected to" or "coupled to" are used to designate a connection or coupling of one element to another element and include both a case where an element is "directly connected or coupled to" another element and a case where an element is "electronically connected or coupled to" another element via still another element.

Through the whole document, the term "on" that is used to designate a position of one element with respect to another element includes both a case that the one element is adjacent to the another element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from the group consisting of components, steps, operation and/or elements described in Markush type and thereby means that the disclosure includes one or more components, steps, operations and/or elements selected from the Markush group.

Below, illustrative embodiments and examples will be described in detail with reference to the accompanying drawings.

In accordance with one aspect of the present disclosure, there is provided a dye-sensitized solar cell, including: a first electrode including a light-absorbing layer formed on a transparent conductive substrate; a second electrode facing the first electrode; and an electrolyte provided between the first electrode and the second electrode, wherein the light-absorbing layer includes a semiconductor layer and a dye represented by the following Chemical Formula 1:

$$Pb_{1-x}Hg_xS;$$ [Chemical Formula 1]

wherein in Chemical Formula 1, x denotes a value from more than about 0 to less than about 1.

By way of example, x may have a value from more than about 0 to about 0.2 or less, from more than about 0 to about 0.4 or less, from more than about 0 to about 0.6 or less, from more than about 0 to about 0.8 or less, from more than about 0 to less than about 1, from about 0.2 or more to about 0.4 or less, from about 0.2 or more to about 0.6 or less, from about 0.2 or more to about 0.8 or less, from about 0.2 or more to less than about 1, from about 0.4 or more to about 0.6 or less, from about 0.4 or more to about 0.8 or less, from about 0.4 or more to less than about 1, from about 0.6 or more to about 0.8 or less, from about 0.6 or more to less than about 1, or from about 0.8 or more to less about 1, but may not be limited thereto. By way of example, x may be set to be from more than about 0 to about 0.5 or less, but may not be limited thereto. Values of 0 and 1 are not included in the range of x. The dye of the dye-sensitized solar cell includes all of Pb, Hg and S and thus is capable of solving problems of a conventional dye-sensitized solar cell containing a ruthenium-based dye, but may not be limited thereto.

In accordance with an illustrative embodiment of the present disclosure, the transparent conductive substrate may include, but may not be limited thereto, a glass substrate containing a material selected from the group consisting of indium tin oxide (ITO), fluorine tin oxide (FTO), ZnO—Ga$_2$O$_3$, ZnO—Al$_2$O$_2$, a tin-based oxide, and combinations thereof; or a plastic substrate. The transparent conductive substrate may not be particularly limited, and any material having conductivity and transparency may be used. By way of non-limiting example, if ITO is used as the transparent conductive substrate, cost cut may be achieved. If SnO$_2$, which is one of tin-based oxides, is used as the transparent conductive substrate, high transparency and heat resistance may be achieved. However, the present disclosure may not be limited thereto.

By way of non-limiting example, the plastic substrate that is included in the transparent conductive substrate may include a polymer selected from the group consisting of Poly(ethylene terephthalate) (PET), poly(ethylene naphthalate) (PEN), poly carbonate (PC), polypropylene (PP), polyimide (PI), tri-acetyl cellulose (TAC), and combinations thereof, but may not be limited thereto.

By way of example, the transparent conductive substrate may be doped with a metal selected from the group consisting of Group 3 metals such as Al, Ga, In, Tl, and combinations thereof, but may not be limited thereto.

By way of non-limiting example, the dye-sensitized solar cell may further include a recombination preventing buffer layer on the transparent conductive substrate, but may not be limited thereto. By way of example, a TiO$_2$ thin film serving as the recombination preventing buffer layer may be formed on the transparent conductive substrate by coating and annealing Ti(IV)bis(ethyl acetoacetate)-diisopropoxide having a concentration of about 0.1 M, but may not be limited thereto. The recombination preventing buffer layer may be selectively included in the dye-sensitized solar cell. Besides the TiO$_2$ thin film, various other materials may be used as a structure material of the recombination preventing buffer layer.

By way of example, the semiconductor layer may include a metal oxide, but may not be limited thereto.

In accordance with an illustrative embodiment of the present disclosure, the semiconductor layer may include an oxide of a metal selected from the group consisting of titanium, tin, zinc, tungsten, zirconium, gallium, indium, yttrium, niobium, tantalum, vanadium, and combinations thereof, but may not be limited thereto.

By way of example, the semiconductor layer may include a metal oxide selected from the group consisting of TiO$_2$, SnO$_2$, ZnO, WO$_3$, Nb$_2$O$_5$, TiSrO$_3$, and combinations thereof, but may not be limited thereto. By way of example, anatase TiO$_2$ may be used as the semiconductor layer, but may not be limited thereto. Here, a material for forming the semiconductor layer applicable to the dye-sensitized solar cell of the present disclosure may not be limited to the aforementioned metal oxides. Further, a single metal oxide or a mixture of two or more metal oxides may be used as the semiconductor layer, but may not be limited thereto.

By way of example, the semiconductor layer may include semiconductor fine particles, but may not be limited thereto. By increasing the surface area of the semiconductor fine particles, the dye adsorbed onto the semiconductor layer may be allowed to absorb a greater quantity of light, so that efficiency of the dye-sensitized solar cell may be improved, but may not be limited thereto. By way of example, in order to increase the surface area, the semiconductor fine particles may have an average particle diameter, e.g., about 50 nm or less. For example, the average particle diameter may range, but may not be limited thereto, e.g., from about 5 nm to about 15 nm, from about 5 nm to about 25 nm, from about 5 nm to about 35 nm, from about 5 nm to about 50 nm, from about 15 nm to about 25 nm, from about 15 nm to about 35 nm, from about 15 nm to about 50 nm, from about 25 nm to about 35 nm, from about 25 nm to about 50 nm, or from about 35 nm to about 50 nm. The average particle diameter of the semiconductor fine particles may proper in the range, e.g., from about 15 nm to about 25 nm, but may not be limited thereto.

In accordance with an illustrative embodiment of the present disclosure, the semiconductor layer may be formed by laminating nanoparticles of a metal oxide, but may not be limited thereto. Here, the nanoparticles of the metal oxide that are laminated to form the metal semiconductor layer may not have the same particle size, but various sizes of nanoparticles of the metal oxide may be laminated to form the semiconductor layer, thus increasing the surface area and improving the efficiency of the dye-sensitized solar cell, but may not be limited thereto. For example, the semiconductor layer may be formed to have an appropriate thickness, e.g., a total thickness of, e.g., about 20 μm by laminating various sizes of nanoparticles of a metal oxide, such as about 20 nm of TiO$_2$ particles, about 40 nm of TiO$_2$ particles and about 500 nm of TiO$_2$ particles, but may not be limited thereto.

In accordance with an illustrative embodiment of the present disclosure, the semiconductor layer may have a thickness from more than about 0 μm to about 40 μm or less, but may not be limited thereto. By way of example, the thickness of the semiconductor layer may be set to be from more than about 0 µm to about 5 µm or less, from more than about 0 µm to about 10 µm or less, from more than about 0 µm to about 20 µm of less, from more than about 0 µm to about 30 µm or less, from more than about 0 µm to about 40 µm or less, from about 5 µm or more to about 10 µm or less, from about 5 µm or more to about 20 µm or less, from about 5 µm or more to about 30 µm or less, from about 5 µm or more to about 40 µm or less, from about 10 µm or more to about 20 µm or less, from about 10 µm or more to about 30 µm or less, from about 10 µm or more to about 40 µm or less, from about 20 µm or more to about 30 µm or less, from about 20 µm or more to about 40 µm or less, or from about 30 µm or more to about 40 µm or less, but may not be limited thereto. Although the semiconductor layer is an essential element of the dye-sensitized solar cell, the thickness of the semiconductor layer may not be particularly limited, and various thicknesses of semiconductor layer ranging from, e.g., several hundreds of nanometers to several tens of micrometers may be included in the dye-sensitized solar cell, but may not be limited thereto. The energy conversion efficiency of the dye-sensitized solar cell may not be increased or decreased in linear proportion to the thickness of the semiconductor layer. For example, when using $TiO_2$ as the semiconductor layer in an experiment of an Example of the present disclosure, the highest energy conversion efficiency is recorded when $TiO_2$ having a thickness of about 10.5 µm is included in the dye-sensitized solar cell as the semiconductor layer, but may not be limited thereto. The optimum thickness of the semiconductor layer and the maximum energy efficiency may vary depending on, for example, specific experiment conditions and the kind of the metal oxide used as the semiconductor layer.

By way of example, the photosensitive dye forming the light-absorbing layer together with the semiconductor layer in the dye-sensitized solar cell in accordance with the first aspect of the present disclosure may be represented by the following Chemical Formula 1:

$Pb_{1-x}Hg_xS$; [Chemical Formula 1]

wherein in Chemical Formula 1, x denotes a value larger than about 0 and smaller than about 1.

In a conventional dye-sensitized solar cell, an organic dye containing a ruthenium metal complex is generally used as a photosensitive dye. In such a case, however, a light absorption wavelength is limited to about 800 nm or less, and light in a long wavelength range cannot be utilized. Thus, there has been a limit in improving photocurrent. Furthermore, since the organic dye containing the ruthenium metal complex is of a high price due to a high price of ruthenium metal raw material. Moreover, the organic dye containing the ruthenium metal complex is adsorbed onto a surface of a metal oxide, thus forming a light-absorbing layer of the dye-sensitized solar cell. The adsorption process, however, takes from a minimum of about 2 hours to a maximum of about 24 hours. Thus, it has been difficult to shorten the manufacturing process, resulting in an increase of a manufacturing cost per unit.

In contrast, when using the dye represented by Chemical Formula 1 of the present disclosure instead of the organic dye containing the ruthenium metal complex, it becomes possible to absorb light in a wider wavelength range. Accordingly, very high photocurrent can be generated and, ultimately, the efficiency of the dye-sensitized solar cell can be ameliorated. Further, since the time for the manufacturing process can be shortened, manufacturing time and cost can be reduced. By way of example, the dye represented by Chemical Formula 1 may be an inorganic quantum dot containing Pb, Hg and S, but may not be limited thereto.

Especially, with regard to improvement of photocurrent, by using the dye-sensitized solar cell including the dye represented by Chemical Formula 1 in accordance with the first aspect of the present disclosure as a photosensitive dye, photocurrent of, e.g., about 26.64 mA/cm² can be generated when other conditions such as the kind of electrolyte are the same as those of the conventional dye-sensitized solar cell. Accordingly, energy conversion efficiency of, e.g., about 5.39% can be expected. Thus, as compared to the conventional technique, energy conversion efficiency and photocurrent improved by about 90% can be achieved. Further, the values of the photocurrent and the energy conversion efficiency that can be achieved by the dye-sensitized solar cell in accordance with the first aspect of the present disclosure may not be limited the aforementioned examples, and a greater amount of photocurrent and a higher energy conversion efficiency may be achieved.

In accordance with an illustrative embodiment of the present disclosure, the dye may be synthesized by using a Hg-containing precursor solution having a concentration from higher than about 0 mM to about 10 mM or less, but may not be limited thereto. By way of example, the dye may be synthesized by using a Hg-containing precursor solution having a concentration from higher than about 0 mM to about 2 mM or less, from higher than about 0 mM to about 5 mM or less, from higher than about 0 mM to about 8 mM or less, from higher than about 0 mM to about 10 mM or less, from about 2 mM or more to about 5 mM or less, from about 2 mM or more to about 8 mM or less, from about 2 mM or more to about 10 mM or less, from about 5 mM or more to about 8 mM or less, from about 5 mM or more to about 10 mM or less, or from about 8 mM or more to about 10 mM or less, but may not be limited thereto. The energy conversion efficiency of the dye-sensitized solar cell may not be increased or decreased in linear proportion to the concentration of the Hg-containing precursor solution. For example, when using $HgCl_2$ as Hg-containing precursor solution in an experiment of an Example of the present disclosure, the highest energy conversion efficiency is recorded when the dye is prepared by using $HgCl_2$ of about 6 mM, but may not be limited thereto. The optimum concentration of the Hg-containing precursor solution and the maximum energy efficiency may vary depending on, for example, specific experiment conditions and the kind of the Hg-containing precursor solution. By way of example, the Hg-containing precursor solution may be, but may not be limited to, $HgCl_2$, $Hg(NO_3)_2$ or $HgBr_2$.

By way of non-limiting example, the light-absorbing layer included in the dye-sensitized solar cell in accordance with the first aspect of the present disclosure may be formed by adsorbing the dye onto the semiconductor layer. A recombination preventing layer may be additionally formed on the dye and included as a part of the dye-sensitized solar cell. By way of example, the recombination preventing layer has great band gap energy and may be formed to improve the energy conversion efficiency of the dye-sensitized solar cell by preventing electrons generated from the dye from recombining with electrolyte and being consumed, but may not be limited thereto. By way of example, the recombination preventing layer may include ZnS, ZnSe, CdS or CdSe, but may not be limited thereto. Various kinds of compounds having great band gap energy may be included in the recombination preventing layer.

In accordance with an illustrative embodiment of the present disclosure, the second electrode may include what is selected from the group consisting of Pt, Au, Ni, Cu, Zn, Ag, In, Ru, Pd, Rh, Ir, Os, C, a conductive polymer, and combinations thereof, but may not be limited thereto. By way of example, by implementing the second electrode by Au which is a highly stable metal, long-term stability of the dye-sensitized solar cell of the present disclosure may be improved, but may not be limited thereto. Any conductive material may be used for the second electrode, i.e., for the counter electrode, without being particularly limited. Even an insulating material may be used as the second electrode as long as a conductive layer is formed on a part of the insulating material facing to the first electrode. By way of non-limiting example, in case that a conductive layer is formed on a transparent substrate, e.g., a glass substrate or a plastic substrate containing a substance selected from the group consisting of indium tin oxide (ITO), fluorine tin oxide (FTO), $ZnO$—$Ga_2O_3$, $ZnO$—$Al_2O_3$, a tin-based oxide, and combinations thereof so as to face to the first electrode, such a structure may be used as the second electrode. Here, the conductive layer may include what is selected from the group consisting of Pt, Au, Ni, Cu, Zn, Ag, In, Ru, Pd, Rh, Ir, Os, C, a conductive polymer, and combinations thereof, but may not be limited thereto. By way of example, the conductive layer may be formed on a rear surface of the transparent conductive substrate by physical vapor deposition (PVD) such as electroplating, sputtering, electron beam deposition or the like, but may not be limited thereto.

By way of example, the second electrode may be formed using a copper/zinc alloy substrate, but may not be limited thereto. By way of example, by etching a part of the copper/zinc alloy substrate using an acid solution such as hydrochloric acid, a copper part of the alloy substrate may be partially exposed, but may not be limited thereto.

In accordance with an illustrative embodiment of the present disclosure, the second electrode may include an alloy substrate coated with a metal sulfide, but may not be limited thereto. By way of example, the metal sulfide may be, but may not be limited to, CoS, NiS, CuS or $Cu_2S$. By way of example, when using a copper/zinc alloy substrate having a part of copper exposed on a surface thereof by being processed by the acid solution, a solution containing sulfur ions may be dropwised into the substrate, and copper sulfide may be formed as a result of reaction between the exposed copper and the sulfur ions in the solution. In this way, the alloy substrate coated with the metal sulfide may be formed. By way of example, the solution containing sulfur ions may be, but may not be limited to, a mixture of, e.g., about 1 M of $Na_2S$ and about 1 M of S. By way of example, the metal sulfide coated on the second electrode may have a function as a catalyst for oxidation-reduction reaction, but may not be limited thereto.

As regards the first aspect of the present disclosure, FIG. 1 is a schematic diagram illustrating a layer structure of a dye-sensitized solar cell in accordance with the first aspect of the present disclosure.

Referring to FIG. 1, the dye-sensitized solar cell of the present disclosure may include a first electrode having a semiconductor layer 5 and a dye 4 formed on a transparent conductive substrate 1; a second electrode 2 facing to the first electrode; and electrolyte 6 provided between the first and second electrodes; and a sealing member 3 for preventing leakage of the electrolyte, but may not be limited thereto. By way of non-limiting example, a Kapton tape, which is a sealing tape, may be used as the sealing member 3.

By way of example, the first electrode may be referred to as a working electrode or a semiconductor electrode, but may not be limited thereto. Further, the second electrode may be referred to as a counter electrode, but may not be limited thereto. A light-absorbing layer included in the first electrode may include, but may not be limited to, the semiconductor layer 5; and the photosensitive dye 4 which is adsorbed onto the semiconductor layer 5 and from which electrons are excited when visible light is absorbed. By way of example, the semiconductor layer 5 may be formed to have, but may not be limited to, a porous structure to increase its surface area so as to adsorb the photosensitive dye 4. Further, by way of example, a recombination preventing buffer layer (not shown) may be further formed between the transparent conductive substrate 1 and the semiconductor layer 5, but may not be limited thereto. By way of non-limiting example, a $TiO_2$ thin film may be used as the recombination preventing buffer layer.

A basic principle of the operation of the dye-sensitized solar cell will be briefly explained. When sun light is incident upon the inside of the dye-sensitized solar cell, photons are absorbed to molecules of the photosensitive dye 4 in the light-absorbing layer. Accordingly, the molecules of the dye 4 experiences electronic transition from a ground state to an excited state, forming electron-hole pairs. Electrons in the excited state may be implanted into conduction band at interfaces of semiconductor fine particles. The implanted electrons may be transferred to the first electrode through the interfaces and then may be moved, through an external circuit, to the second electrode 2 which is the counter electrode that faces to the first electrode. Meanwhile, the dye 4 oxidized as a result of the electronic transition may be reduced in the electrolyte 6, and oxidized ions in the electrolyte 6 may make a reduction reaction with the electrons that have reached the interface of the second electrode 2 to thereby obtain charge neutrality. In this way, the dye-sensitized solar cell may be operated, but may not be limited thereto.

In accordance with a second aspect of the present disclosure, there is provided method for manufacturing a dye-sensitized solar cell as a first aspect of the present disclosure, the method including: forming a semiconductor layer on a transparent conductive substrate; forming a light-absorbing layer by adsorbing a dye represented by the following Chemical Formula 1 onto the semiconductor layer to thereby form a first electrode including the light-absorbing layer formed on the transparent conductive substrate; assembling the first electrode and a second electrode such that the first electrode and the second electrode face to each other; and injecting electrolyte between the first electrode and the second electrode:

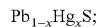  [Chemical Formula 1]

$Pb_{1-x}Hg_xS$;

wherein in Chemical Formula 1, x denotes a value from more than about 0 to less than about 1.

The second aspect of the present disclosure is directed to the method for manufacturing the dye-sensitized solar cell in accordance with the first aspect of the present disclosure. Elaboration of parts that are the same as those described in the first aspect of the present disclosure will be omitted, and the description of the first aspect of the present disclosure may also be applicable to the second aspect of the present disclosure, though omitted here.

Meanwhile, a general manufacturing method for a dye-sensitized solar cell is well known in the relevant art and may be readily understood by those skilled in the art. Thus, detailed description of the general manufacturing method for the dye-sensitized solar cell will be omitted here. Instead, a process of forming the light-absorbing layer, which is an inventive feature of the second aspect of the present disclosure, will be elaborated below.

As in the first aspect of the present disclosure, the light-absorbing layer may include a semiconductor layer, and a dye represented by the following Chemical Formula 1:

$$Pb_{1-x}Hg_xS;\qquad\text{[Chemical Formula 1]}$$

wherein in Chemical Formula 1, x denotes a value from more than about 0 to less than about 1.

In accordance with an illustrative embodiment of the present disclosure, the semiconductor layer may include a metal oxide selected from $TiO_2$, $SnO_2$, ZnO, $WO_3$, $Nb_2O_5$, $TiSrO_3$, and combinations thereof, but may not be limited thereto.

In accordance with an illustrative embodiment of the present disclosure, the semiconductor layer may be formed by laminating nanoparticles of a metal oxide, but may not be limited thereto. Here, the nanoparticles of the metal oxide that are laminated to form the metal semiconductor layer may not have the same particle size, but various sizes of nanoparticles of the metal oxide may be laminated to form the semiconductor layer, thus increasing a surface area of the semiconductor layer and improving the efficiency of the dye-sensitized solar cell, but may not be limited thereto.

In order to form the light-absorbing layer, a semiconductor layer may be first formed on a rear surface of the transparent conductive substrate of the first electrode. By way of example, the semiconductor layer may be formed through the process of coating paste containing semiconductor fine particles on the rear surface of the transparent conductive substrate and then performing heat-treatment, but may not be limited thereto. To elaborate, the heat treatment may be performed at a temperature ranging, e.g., from about 400° C. to about 600° C. for about 30 minutes in case that a binder is additionally added, or may be performed at a temperature of, e.g., about 200° C. in case that no binder is added, but may not be limited thereto.

By way of example, the semiconductor layer may be formed on the transparent conductive substrate by various methods such as doctor blading, screen printing, spin coating or spraying, but may not be limited thereto. Depending on the method selected to form the semiconductor layer, physical properties required for the paste containing semiconductor fine particles used as a raw material for forming the semiconductor layer may be differed. The methods that can be used to form the semiconductor layer may not be limited to the aforementioned examples, but other general wet coating methods or the like may be also be used.

In accordance with an illustrative embodiment of the present disclosure, the semiconductor layer may have a thickness from more than about 0 μm to about 40 μm or less, but may not be limited thereto. By way of example, the thickness of the semiconductor layer may be set to be from more than about 0 μm to about 5 μm or less, from more than about 0 μm to about 10 μm or less, from more than about 0 μm to about 20 μm or less, from more than about 0 μm to about 30 μm or less, from more than about 0 μm to about 40 μm or less, from about 5 μm or more to about 10 μm or less, from about 5 μm or more to about 20 μm or less, from about 5 μm of more to about 30 μm or less, from about 5 μm or more to about 40 μm or less, from about 10 μm or more to about 20 μm or less, from about 10 μm or more to about 30 μm or less, from about 10 μm or more to about 40 μm or less, from about 20 μm or more to about 30 μm or less, from about 20 μm or more to about 40 μm or less, or from about 30 μm or more to about 40 μm or less, but may not be limited thereto. Although the semiconductor layer is an essential element of the dye-sensitized solar cell, the thickness of the semiconductor layer may not be particularly limited, and various thicknesses of semiconductor layer ranging, e.g., from several hundreds of nanometers to several tens of micrometers may be included in the dye-sensitized solar cell, but may not be limited thereto. The energy conversion efficiency of the dye-sensitized solar cell may not be increased or decreased in linear proportion to the thickness of the semiconductor layer. For example, when using $TiO_2$ as the semiconductor layer in an experiment of an Example of the present disclosure, the highest energy conversion efficiency is recorded when $TiO_2$ having a thickness of about 10.5 μm is included in the dye-sensitized solar cell as the semiconductor layer, but may not be limited thereto. The optimum thickness of the semiconductor layer and the maximum energy efficiency may vary depending on, for example, specific experiment conditions and the kind of the metal oxide used as the semiconductor layer.

In accordance with an illustrative embodiment of the present disclosure, the semiconductor layer may include a porous structure, but may not be limited thereto.

In accordance with an illustrative embodiment of the present disclosure, the semiconductor layer may be formed by coating a mixture of a metal oxide with a polymer on the transparent conductive substrate followed by heat-treatment, but may not be limited thereto. As a result of the heat-treatment, the polymer part of the mixture of the metal oxide and the polymer would be eliminated, and only the metal oxide part would be left. As a consequence, the semiconductor layer may have a porous structure, but may not be limited thereto. To form the porous structure of the semiconductor layer, various other methods besides the example method as mentioned above may be utilized.

By way of example, the polymer may include what is selected from the group consisting of ethylene cellulose (EC), hydroxypropyl cellulose (HPC), polyethylene glycol (PEG), polyethylene oxide (PEO), polyvinyl alcohol (PVA), polyvinyl pyrrolidone (PVP), and combinations thereof, but may not be limited thereto. However, the polymer to be coated on the semiconductor layer may not be limited to the aforementioned examples, but various other kinds of polymers may also be used as long as no organic material remains after the heat-treatment is performed. It may be desirable to select the polymer having an appropriate molecular weight by considering coating conditions including a coating method, but may not be limited thereto.

By way of example, the manufacturing method for the dye-sensitized solar cell may additionally include coating a polymer on the semiconductor layer and performing heat-treatment thereon, but may not be limited thereto. By coating the polymer on the semiconductor layer and heat-treating it, porosity of the semiconductor layer may be further improved, but may not be limited thereto. Further, by coating the polymer on the semiconductor layer, improvement of dispersibility of the semiconductor fine particles included in the semiconductor layer, improvement of film forming property due to the increase of viscosity and improvement of adhesiveness between the substrate and the semiconductor layer may also be expected, but may not be limited thereto. Here, the temperature for the heat-treatment may range, e.g., from about 400° C. to about 500° C., from about 400° C. to about 600° C., or from about 500° C. to about 600° C., but may not be limited thereto. Further, the polymer may be selected from the aforementioned group consisting of ethylene cellulose (EC), hydroxypropyl cellulose (HPC), polyethylene glycol (PEG), polyethylene oxide (PEO), polyvinyl alcohol (PVA), polyvinyl pyrrolidone (PVP), and combinations thereof, but may not be limited thereto.

After the semiconductor layer is formed on the transparent conductive substrate in accordance with the above-described method, the light-absorbing layer can be formed by adsorbing the dye represented by Chemical Formula 1 as follows on the semiconductor layer. In the following Chemical Formula 1, x denotes a value from more than about 0 to less than about 1:

[Chemical Formula 1]

In accordance with an illustrative embodiment of the present disclosure, the light-absorbing layer may be formed by adsorbing the dye by way of repetitively performing immersing the semiconductor layer in a Pb-containing precursor solution, a Hg-containing precursor solution and a S-containing precursor solution, respectively, but may not be limited thereto. By way of example, the Pb-containing precursor solution may include, but may not be limited to, $PbCl_2$, $PbBr_2$, or $Pb(CH_3COO)_2$. By way of example, the Hg-containing precursor solution may include, but may not be limited thereto, $HgCl_2$, $Hg(NO_2)_2$, or $HgBr_2$.

In accordance with an illustrative embodiment of the present disclosure, the Hg-containing precursor solution may have a concentration from higher than about 0 mM to about 10 mM or less, but may not be limited thereto. By way of example, the Hg-containing precursor solution may have a concentration from higher than about 0 mM to about 2 mM or less, from higher than about 0 mM to about 5 mM or less, from higher than about 0 mM to about 8 mM or less, from higher than about 0 mM to about 10 mM or less, from about 2 mM to about 5 mM or less, from about 2 mM or more to about 8 mM or less, from about 2 mM or more to about 10 mM or less, from about 5 mM or more to about 8 mM or less, from about 5 mM or more to about 10 mM or less, or from about 8 mM or more to about 10 mM or less, but may not be limited thereto. Energy conversion efficiency of the dye-sensitized solar cell may not be increased or decreased in linear proportion to the concentration of the Hg-containing precursor solution. For example, when using $HgCl_2$ as Hg-containing precursor solution in an experiment of an Example of the present disclosure, the highest energy conversion efficiency is recorded when the dye is prepared by using $HgCl_2$ of about 6 mM, but may not be limited thereto. The optimum concentration of the Hg-containing precursor solution and the maximum energy efficiency may vary depending on, for example, specific experiment conditions and the kind of the Hg-containing precursor solution.

Furthermore, by way of example, the dye may be adsorbed onto the semiconductor layer in order to form the light-absorbing layer by spraying, coating or immersing a dispersion liquid containing the dye represented by Chemical Formula 1, but may not be limited thereto. By way of non-limiting example, the dye may be adsorbed by spin coating, dip coating, screen coating, spray coating, electro spinning, or the like.

An organic dye containing ruthenium metal that has been generally used as a photosensitive dye in a conventional dye-sensitized solar cell has a drawback in that it takes from a minimum of about 2 hours to a maximum of about 24 hours for the dye to be adsorbed onto the semiconductor layer, thus resulting in an increase of manufacturing time. Meanwhile, in case of manufacturing the dye-sensitized solar cell containing the inorganic dye represented by Chemical Formula 1 in accordance with the second aspect of the present disclosure, the time taken for the adsorption of the dye can be greatly reduced as compared to the case of using the organic dye containing the ruthenium metal. Accordingly, time and cost can be saved. For example, when manufacturing the dye-sensitized solar cell containing the inorganic dye represented by Chemical Formula 1 in accordance with the second aspect of the present disclosure, the adsorption process can be performed in a relatively short period of time, e.g., within about 30 minutes by using a method of coating the semiconductor layer by immersing the semiconductor layer in a solution at a room temperature for the adsorption of the dye, but may not be limited thereto.

By way of example, after the dye is adsorbed onto the semiconductor layer to form the light-absorbing layer, it may be possible to additionally perform a process of forming a recombination preventing layer on the dye, but may not be limited thereto. By way of example, the recombination preventing layer has great band gap energy and may be formed to improve the energy conversion efficiency of the dye-sensitized solar cell by preventing electrons generated from the dye from recombining with electrolyte and being consumed, but may not be limited thereto. By way of example, the recombination preventing layer may include ZnS, ZnSe, CdS or CdSe, but may not be limited thereto. Various kinds of compounds having great band gap energy may be included in the recombination preventing layer. By way of example, after the dye is adsorbed onto the semiconductor layer, a process of immersing the structure in about 0.1 M of $Zn(CH_2COO)_2$ (zinc acetate) aqueous solution and about 0.1 M of $Na_2S$ aqueous solution in sequence and cleaning the structure with water was repeated numerous times. As a result, recombination preventing layer of a ZnS layer was additionally formed on the dye, but may not be limited thereto.

Depending on the method, after the first electrode is formed, the second electrode was positioned to face to the first electrode, and the two electrodes were hermetically sealed. Thereafter, electrolyte was injected into a space formed between the first electrode and the second electrode. Through the above processes, the dye-sensitized solar cell of the present disclosure may manufacture.

In accordance with an illustrative embodiment of the present disclosure, the second electrode may include what is selected from the group consisting of Pt, Au, Ni, Cu, Zn, Ag, In, Ru, Pd, Rh, Ir, Os, C, a conductive polymer, and combinations thereof, but may not be limited thereto.

In accordance with an illustrative embodiment of the present disclosure, the second electrode may include an alloy substrate coated with a metal sulfide, but may not be limited thereto. By way of example, the metal sulfide may be, but may not be limited to, CoS, NiS, CuS or $Cu_2S$. By way of example, when using a copper/zinc alloy substrate having a part of copper exposed on a surface thereof by being processed by the acid solution, a solution containing sulfur ions may be dropwised into the substrate, and copper sulfide may be formed as a result of reaction between the exposed copper and the sulfur ions in the solution. In this way, the alloy substrate coated with the metal sulfide may be formed. By way of example, the solution containing sulfur ions may be, but may not be limited thereto, a mixture of, e.g., about 1 M of $Na_2S$ and about 1 M of S. By way of example, the metal sulfide coated on the second electrode may have a function as a catalyst for oxidation-reduction reaction, but may not be limited thereto.

By way of example, the electrolyte injected between the first and second electrodes may have a function of receiving electrons from the second electrode serving as the counter electrode and delivering the received electrons to dye molecules that have lost their electrons, but may not be limited thereto. The electrolyte may be uniformly dispersed in the space within the light-absorbing layer, but may not be limited thereto. By way of example, the electrolyte may be implemented by an electrolyte solution, and the electrolyte solution may contain a material, as an iodide/triodide pair, capable of receiving electrons from the counter electrode and delivering the received electrons to dye molecules by oxidation and reduction, but may not be limited thereto. By way of example, a solution prepared by dissolving iodine in acetonitrile may be used as the electrolyte, but may not be limited thereto, and any material having a hole-conductive function may be used as the electrolyte. By way of example, an aqueous solution prepared by mixing about 1 M of $Na_2S$ and about 1 M of S may be used as the electrolyte, but may not be limited thereto.

By way of example, the sealing member provided to prevent leakage of the electrolyte may contain a thermoplastic polymer material and may be cured by heat or ultraviolet ray, but may not be limited thereto. By way of example, the sealing member may be formed by using an epoxy resin, but may not be limited thereto. Alternatively, a gap between the first electrode and the second electrode may be maintained by inserting a polymer film having a thickness of several tens of micrometers therebetween, but may not be limited thereto. Still alternatively, the first electrode and the second electrode may be hermetically jointed by using a Kapton adhesive tape.

Hereinafter, examples of the present disclosure will be described in further detail. However, it would be understood by those skilled in the art that the present disclosure may not be limited thereto.

EXAMPLES

1. Manufacture of Dye-Sensitized Solar Cell
(1) Process of Forming Semiconductor Layer on Transparent Conductive Substrate In order to form a transparent conductive substrate included in a dye-sensitized solar cell in accordance with the first aspect of the present disclosure, a FTO (Fluorine-doped Tin Oxide) glass (Pilkington, TEC-8, 8 Ω/sq) was cleaned in ethanol by using ultrasonic wave for about 20 minutes. Thereafter, the FTO glass was coated by spin coating using about 0.1 M of Ti(IV)bis(ethyl acetoacetate)-diisopropoxide (produced by Aldirch)/1-buthanol (produced by Aldirch), so that a $TiO_2$ thin film serving as a recombination preventing buffer layer was formed, and the transparent conductive substrate included in the dye-sensitized solar cell was prepared.

Subsequently, in order to form a semiconductor layer on the transparent conductive substrate, after heat-treating the transparent conductive substrate at about 550° C. for about minutes, a $TiO_2$ paste was coated by using a doctor blading method. At this time, the thickness of the coated $TiO_2$ paste was adjusted by using a tape. Upon the completion of the coating process, heat-treatment was performed at about 550° C. for about 1 hours, so that a porous $TiO_2$ semiconductor layer was formed.

(2) Process of Adsorbing Photosensitive Dye onto Semiconductor Layer

Thereafter, a process of adsorbing a photosensitive dye was performed in order to form a first electrode including a light-absorbing layer by adsorbing the photosensitive dye onto the $TiO_2$ film serving as the semiconductor layer formed on the FTO glass as the transparent conductive substrate.

To elaborate, a process of immersing the transparent conductive substrate having thereon the semiconductor layer in a first solution containing about 0.1 M of $Pb(NO_2)_2$ and a veried concentration of $HgCl_2$ and a second solution containing about 0.1 M of $Na_2S$ in sequence and then cleaning the transparent conductive substrate was repeated several times. As a result, inorganic quantum dot of $Pb_{1-x}Hg_xS$ which is the photosensitive dye were adsorbed onto the surface of the semiconductor layer. Here, the first solution contains $Pb^{2+}$ and $Hg^{2+}$ ions, and the second solution contains $S^{2-}$ ions. Further, the concentration of $HgCl_2$ of the first solution was varied to about 0 mM, about 2 mM, about 4 mM, about 6 mM, and about 8 mM in order to alter an x value of $Pb_{1-x}Hg_xS$ which is a chemical formula of the photosensitive dye and to measure a resultant variation in energy conversion efficiency.

In this way, by adsorbing the photosensitive dye onto the semiconductor layer, the first electrode of the dye-sensitized solar cell was formed. For reference, the above process was performed at a room temperature and it took about 30 minutes to complete the process, which is an improvement as compared to a conventional technique of adsorbing ruthenium metal which requires high cost and long process time. Further, as stated above, by repeating several times the process of immersing the transparent conductive substrate in the first solution and the second solution in sequence, the photosensitive dye containing all of Pb, Hg and S, not a part thereof, could be adsorbed onto the semiconductor layer.

After forming the first electrode of the dye-sensitized solar cell by adsorbing the photosensitive dye onto the semiconductor layer, a process of immersing the structure in about 0.1 M of $Zn(CH_2COO)_2$ aqueous solution and about 0.1 M of $Na_2S$ aqueous solution in sequence and cleaning the structure with water was repeated twice. As a result, a ZnS layer was additionally formed on the photosensitive dye. This Zns layer having great band gap energy was formed to improve the energy conversion efficiency of the dye-sensitized solar cell by preventing electrons generated from the photosensitive dye from being consumed by being re-combined with the electrolyte.

(3) Process of Forming Second Electrode

An alloy substrate coated with metal sulfide was fabricated as the second electrode serving as a counter electrode in the dye-sensitized solar cell in accordance with the present disclosure. To elaborate, a copper/zinc alloy substrate was prepared. Then, by processing the copper/zinc ally substrate with hydrochloric acid, a part of the zinc portion on the surface of the copper/zinc alloy substrate was etched, thus allowing a part of the copper to be exposed at the surface of the alloy substrate. Then, by dripping a solution containing about 1 M of $Na_2S$ and about 1 M of S, the exposed copper and sulfur ions include in this solution were made to react with each other, so that metal sulfide such as copper sulfide was coated on the alloy substrate.

(4) Process of Sealing Gap Between First and Second Electrodes and Injecting Electrolyte The second electrode was positioned to face to the first electrode, and the two electrodes were jointed and hermetically sealed by using a Kapton adhesive tape as a sealing tape. Thereafter, electrolyte was injected into a space formed between the first and second electrodes. A solution containing about 1 M of $Na_2S$ and about 1 M of S was used as the electrolyte. Through the above processes, the dye-sensitized solar cell in accordance with the present disclosure was manufactured.

2. Evaluation of Characteristics of Dye-Sensitized Solar Cell

In the present Example, an experiment for evaluating characteristics of the dye-sensitized solar cell manufactured in accordance with the method of 1 was conducted. The result is provided in FIGS. 2 to 5.

Figure 2:
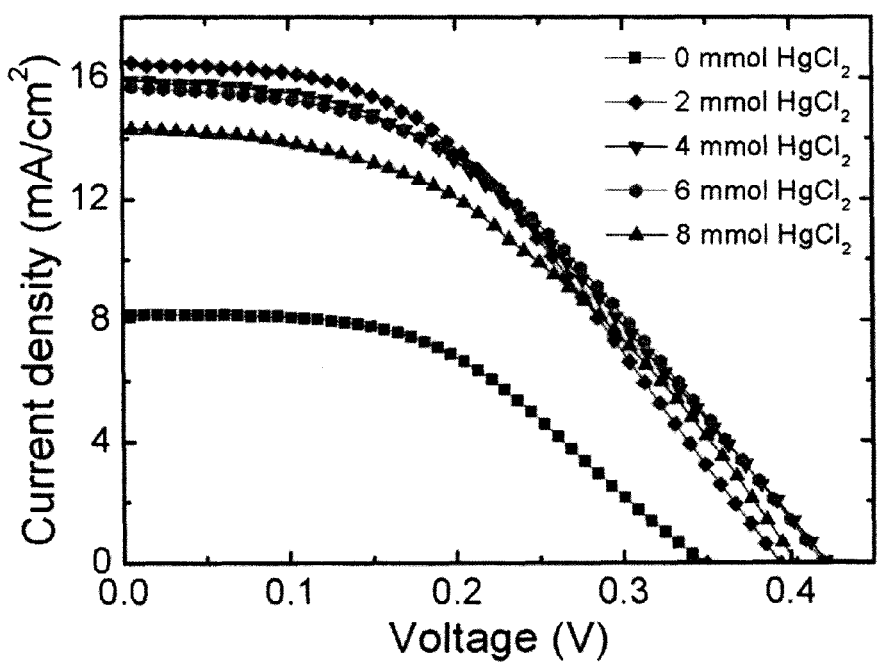
FIG. 2 is a graph showing a variation in a photocurrent-voltage characteristic when a concentration of a Hg-containing precursor solution for use in preparing a dye included in a dye-sensitized solar cell is varied in accordance with an Example of the present disclosure.

FIG. 2 is a graph showing a variation in a photocurrent-voltage characteristic when the concentration of the Hg-containing precursor solution used to prepare the dye included in the dye-sensitized solar cell was varied.

Figure 3:
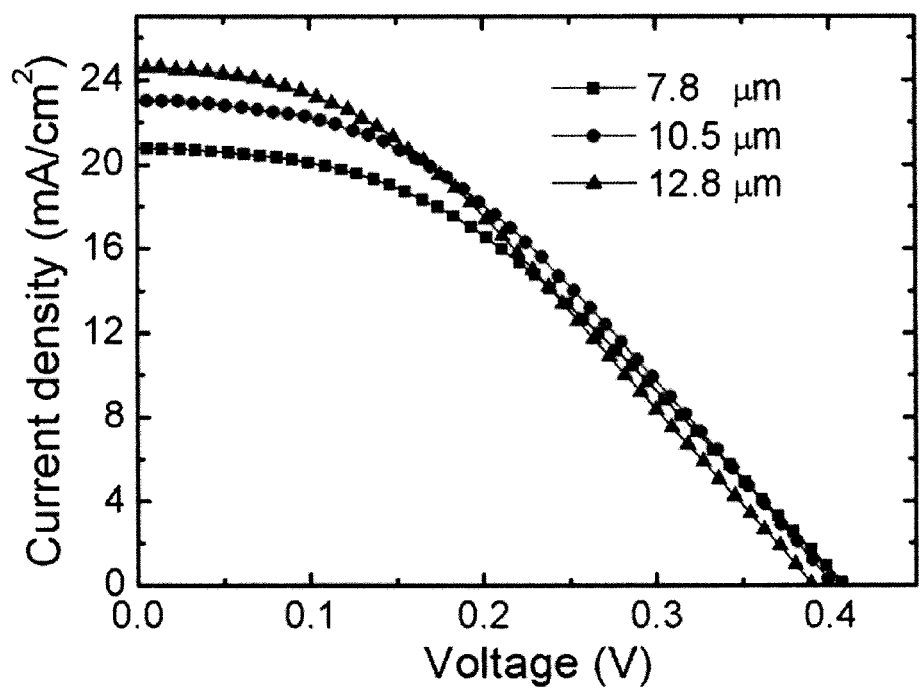
FIG. 3 is a graph showing a variation in a photocurrent-voltage characteristic when a thickness of a semiconductor layer included in a dye-sensitized solar cell is varied in accordance with an Example of the present disclosure.

FIG. 3 is a graph showing a variation in a photocurrent-voltage characteristic when the thickness of the semiconductor layer included in the dye-sensitized solar cell was varied.

Figure 4:
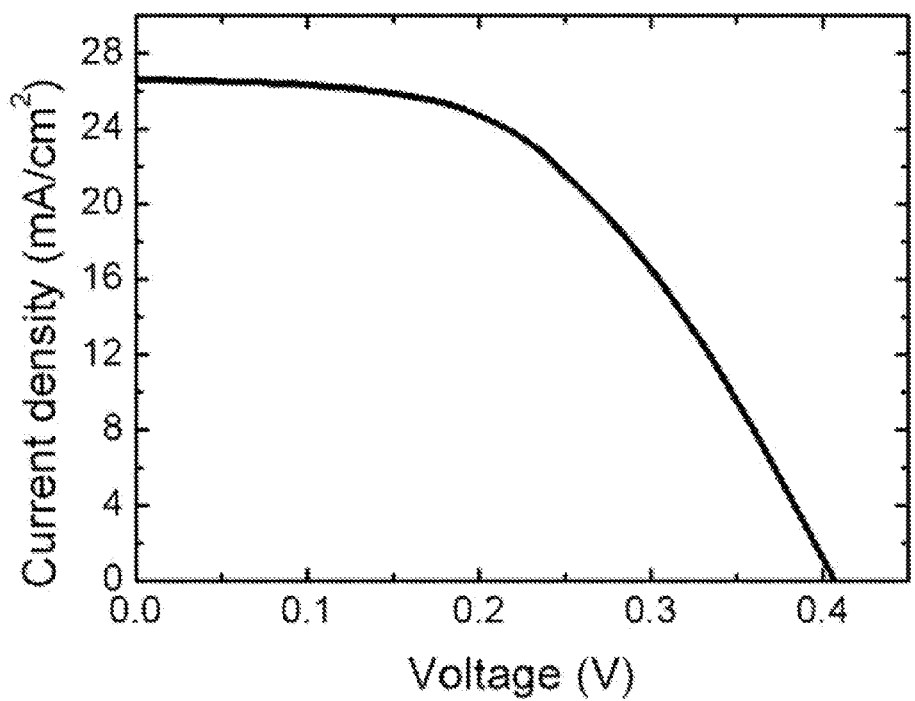
FIG. 4 is a graph showing a photocurrent-voltage characteristic when a semiconductor layer included in a dye-sensitized solar cell is formed by laminating various sizes of nanoparticles of a metal oxide in accordance with an Example of the present disclosure.
Figure 5:
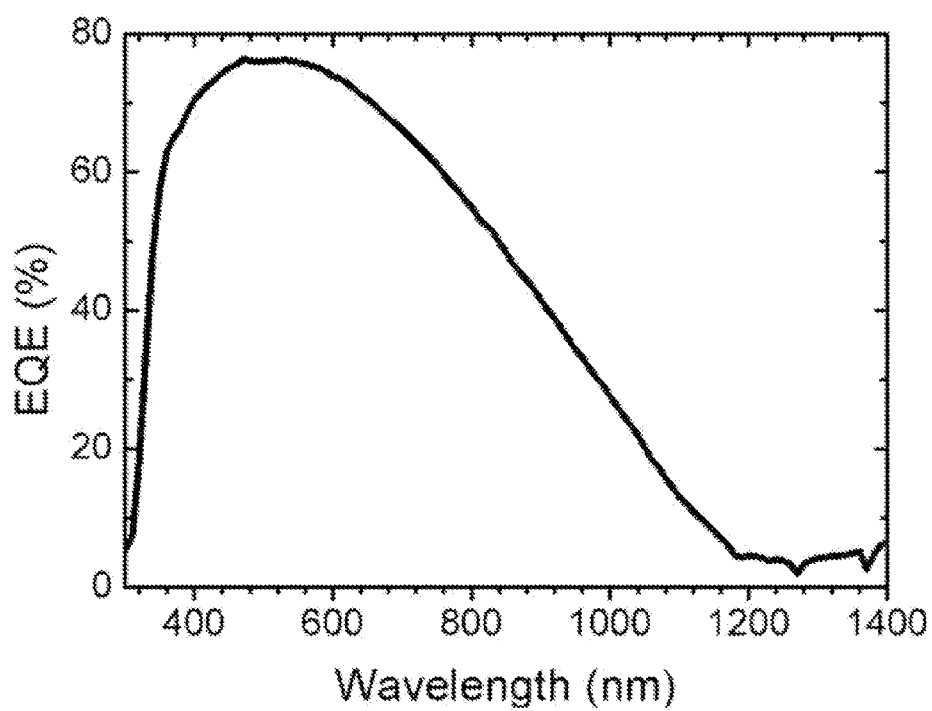
FIG. 5 is a graph showing a variation in external quantum efficiency (EQE) depending on a wavelength when a semiconductor layer included in a dye-sensitized solar cell is formed by laminating various sizes of nanoparticles of a metal oxide in accordance with an Example of the present disclosure.

FIGS. 4 and 5 provide a graph showing a photocurrent-voltage characteristic and a graph showing a variation in external quantum efficiency (EQE) depending on a wavelength, respectively, when the semiconductor layer included in the dye-sensitized solar cell was formed by laminating various sizes of nanoparticles of metal oxide.

Hereinafter, characteristics of the dye-sensitized solar cell in accordance with the present disclosure will be described in further detail with reference to the graphs shown in FIGS. 2 to 5.

(1) Photocurrent-Voltage Characteristic Depending on Concentration of Hg-Containing Precursor Solution Dye-sensitized solar cells were manufactured under the same conditions as those described in the manufacture of the dye-sensitized solar cell of the method of 1 except the concentration of $HgCl_2$ as a Hg-containing precursor solution used in the dye adsorption process. Then, photocurrent-voltage characteristics of the dye-sensitized solar cells were investigated, and the measurement results are provided in Table 1 and FIG. 2. Here, the concentration of $HgCl_2$ was varied to about 0 mM, about 2 mM, about 4 mM, about 6 mM, and about 8 mM.

At this time, the measurement of the photocurrent-voltage characteristic was performed under standard condition, i.e., at about 1.5 G of AM and under 1 solar condition (about 100 mW/cm$^2$) by using a solar simulator. To elaborate, Table 1 shows variations in photocurrent density ($J_{sc}$), photovoltage ($V_{cc}$), fill factor (FF) and energy conversion efficiency ($\eta$) depending on a variation in the concentration of $HgCl_2$. The other conditions except the concentration of $HgCl_2$ such as an area or a thickness of a semiconductor layer included in a light-absorbing layer were maintained constant.

TABLE 1

| $HgCl_2$ concentration | Photocurrent density (mA/cm$^2$) | Photo-voltage (V) | FF (%) | Efficiency (%) | Area (cm$^2$) | Thickness (μm) |
| --- | --- | --- | --- | --- | --- | --- |
| 0 mM | 8.20 | 0.348 | 47.66 | 1.36 | 0.482 | 6.7 |
| 2 mM | 16.47 | 0.393 | 42.80 | 2.77 | 0.422 | 6.7 |
| 4 mM | 15.90 | 0.422 | 41.08 | 2.75 | 0.479 | 6.5 |
| 6 mM | 15.71 | 0.419 | 42.58 | 2.80 | 0.435 | 6.5 |
| 8 mM | 14.34 | 0.403 | 42.91 | 2.48 | 0.438 | 6.5 |

FIG. 2 is a graph showing a variation in a photocurrent-voltage characteristic depending on a variation in the concentration of $HgCl_2$ of the dye-sensitized solar cell in the present Example. FIG. 2 was created based on the data of Table 1. As can be seen from Table 1 and FIG. 2, it was observed that the energy conversion efficiency was highest when the concentration of $HgCl_2$ was set to be about 6 mM.

(2) Variation in Photocurrent-Voltage Characteristic Depending on Thickness of Semiconductor Layer Dye-sensitized solar cells were manufactured under the same conditions as those described in the manufacture of the dye-sensitized solar cell of the method of 1 except the thickness of a semiconductor layer. Then, photocurrent-voltage characteristics of the dye-sensitized solar cells were measured in order to find out an appropriate thickness of the semiconductor layer, and the measurement results are provided in Table 2 and FIG. 3. Here, the concentration of $HgCl_2$ was fixed to about 6 mM, which was found out to be optimum in Table 1 and FIG. 2, and the thickness of $TiO_2$ was varied to about 7.8 μm, about 10.5 μm, and about 12.8 μm.

At this time, the measurement of the photocurrent-voltage characteristic was performed under standard condition, i.e., at about 1.5 G of AM and under 1 solar condition (about 100 mW/cm$^2$) by using a solar simulator. To elaborate, Table 2 shows variations in photocurrent density ($J_{sc}$), photovoltage ($V_{cc}$), fill factor (FF), and energy conversion efficiency ($\eta$) depending on a variation in the thickness of $TiO_2$ which is the semiconductor layer. The other conditions except the thickness of the semiconductor layer $TiO_2$, such as an area or a thickness of the semiconductor layer included in a light-absorbing layer, were maintained constant.

TABLE 2

| $TiO_2$ Thickness | Photocurrent density (mA/cm$^2$) | Photo-voltage (V) | FF (%) | Efficiency (%) | Area (cm$^2$) | Thickness (μm) |
| --- | --- | --- | --- | --- | --- | --- |
| 7.8 μm | 20.78 | 0.408 | 39.97 | 3.39 | 0.428 | 7.8 |
| 10.5 μm | 23.03 | 0.401 | 39.65 | 3.66 | 0.470 | 10.5 |
| 12.8 μm | 24.67 | 0.390 | 36.51 | 3.51 | 0.475 | 12.8 |

FIG. 3 is a graph showing a variation in a photocurrent-voltage characteristic depending on a variation in the thickness of the $TiO_2$ layer of the dye-sensitized solar cell in the present Example. FIG. 3 was created based on Table 2. As can be seen from Table 2 and FIG. 3, it was found out that the energy conversion efficiency was highest when the thickness of the $TiO_2$ layer was set to be about 10.5 μm.

(3) Photocurrent-Voltage Characteristic (FIG. 4) in Case of Forming Semiconductor Layer by Laminating Nanoparticles and External Quantum Efficiency (EQE) According to Wavelength When manufacturing a dye-sensitized solar cell in accordance with the method of 1, a semiconductor layer was formed to have a total thickness of about 20 μm by vertically laminating $TiO_2$ nanoparticles having sizes of about 20 nm, about 40 nm, and about 500 nm. The other elements of the dye-sensitized solar cell were manufactured through the processes described in the method of 1. Then, a photocurrent-voltage characteristic and external quantum efficiency (EQE) of the dye-sensitized solar cell were measured, and the results are provided in the graphs of FIGS. 4 and 5 and Table 3. Here, referring back to Table 1 and FIG. 2, the concentration of $HgCl_2$ was fixed to an optimum condition, i.e., about 6 mM.

At this time, the measurement of the photocurrent-voltage characteristic was performed under standard condition i.e., at about 1.5 G of AM and under 1 solar condition (about 100 mW/cm$^2$) by using a solar simulator. To elaborate, Table 3 shows photocurrent density ($J_{sc}$), photovoltage ($V_{cc}$), fill factor (FF), and energy conversion efficiency ($\eta$). For reference, the area and the thickness of the semiconductor layer included in the dye-sensitized solar cell were specified together.

TABLE 3

| Photocurrent density (mA/cm$^2$) | Photovoltage (V) | FF (%) | Efficiency (%) | Area (cm$^2$) | Thickness (μm) |
| --- | --- | --- | --- | --- | --- |
| 26.64 | 0.407 | 49.73 | 5.39 | 0.467 | 20 |

FIG. 4 is a graph showing a photocurrent-voltage characteristic of the dye-sensitized solar cell in accordance with the present Example. FIG. 4 was created based on the data of FIG. 3. Further FIG. 5 is a graph showing a variation in external quantum efficiency (EQE) depending on a wavelength in the dye-sensitized solar cell in accordance with the present Example.

For comparison, in case of using ruthenium-based dye (N710) as a photosensitive dye in a conventional dye-sensitized solar cell, a light absorption wavelength range was limited to about 800 nm or less. However, as can be seen from the graphs of FIGS. 4 and 5, by using the inorganic dye represented by the chemical formula $Pb_{1-x}Hg_xS$ as the photosensitive dye in accordance with the illustrative embodiment, the light absorption wavelength range was expanded to about 1,400 nm. Accordingly, as compared to the conventional dye-sensitized solar cell capable of generating about 14 mA/cm² of photocurrent, it was proved that the dye-sensitized solar cell in accordance with the illustrative embodiment could generate about 26.64 mA/cm² of photocurrent, which marks an increment of about 90% or less as compared to that of the conventional dye-sensitized cell.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:

1. A dye-sensitized solar cell, comprising:
   a first electrode including a light-absorbing layer formed on a transparent conductive substrate;
   a second electrode facing the first electrode; and
   an electrolyte provided between the first electrode and the second electrode,
   wherein the light-absorbing layer includes a semiconductor layer, and a dye represented by the following Chemical Formula 1:

$Pb_{1-x}Hg_xS$;  [Chemical Formula 1:]

wherein in Chemical Formula 1, 0<x<1, further comprising a recombination preventing layer provided between the dye and the electrolyte.

2. The dye-sensitized solar cell of claim 1, wherein the transparent conductive substrate includes a glass substrate containing a material selected from the group consisting of indium tin oxide (ITO), fluorine tin oxide (FTO), ZnO—Ga$_2$O$_3$, ZnO—Al$_2$O$_3$, a tin-based oxide, and combinations thereof; or a plastic substrate.

3. The dye-sensitized solar cell of claim 1, wherein the semiconductor layer includes an oxide of a metal selected from the group consisting of titanium, tin, zinc, tungsten, zirconium, gallium, indium, yttrium, niobium, tantalum, vanadium, and combinations thereof.

4. The dye-sensitized solar cell of claim 1, wherein the semiconductor layer is formed by laminating nanoparticles of a metal oxide.

5. The dye-sensitized solar cell of claim 1, wherein the semiconductor layer has a thickness from greater than 0 μm to about 40 μm.

6. The dye-sensitized solar cell of claim 1, wherein the dye is synthesized by using a Hg-containing precursor solution having a concentration from greater than 0 mM to about 10 mM.

7. The dye-sensitized solar cell of claim 1, wherein the second electrode includes what is selected from the group consisting of Pt, Au, Ni, Cu, Zn, Ag, In, Ru, Pd, Rh, Ir, Os, C, a conductive polymer, and combinations thereof.

8. The dye-sensitized solar cell of claim 1, wherein the second electrode includes an alloy substrate coated with a metal sulfide.

9. A method for manufacturing a dye-sensitized solar cell as claimed in claim 1, the method comprising:
   forming a semiconductor layer on a transparent conductive substrate;
   forming a light-absorbing layer by adsorbing a dye represented by the following Chemical Formula 1 onto the semiconductor layer to thereby form a first electrode including the light-absorbing layer formed on the transparent conductive substrate;
   assembling the first electrode and a second electrode such that the first electrode and the second electrode face to each other; and
   injecting electrolyte between the first electrode and the second electrode:

$Pb_{1-x}Hg_xS$;  [Chemical Formula 1]

wherein in Chemical Formula 1, 0<x<1.

10. The method of claim 9, wherein the semiconductor layer is formed by laminating nanoparticles of a metal oxide.

11. The method of claim 9, wherein the semiconductor layer has a thickness from greater than 0 μm to about 40 μm.

12. The method of claim 9, wherein the semiconductor layer includes a porous structure.

13. The method of claim 9, wherein the semiconductor layer is formed by coating a mixture of a metal oxide with a polymer on the transparent conductive substrate followed by heat-treatment.

14. The method of claim 9, wherein forming the light-absorbing layer includes adsorbing the dye by repeatedly performing a process of immersing the semiconductor layer in a Pb-containing precursor solution, a Hg-containing precursor solution and a S-containing precursor solution, respectively.

15. The method of claim 14, wherein the Hg-containing precursor solution includes a concentration from greater than 0 mM to about 10 mM.

16. The method of claim 9, wherein the second electrode includes an alloy substrate coated with a metal sulfide.

17. The dye-sensitized solar cell of claim 1, wherein the dye absorbs a wavelength range up to about 1,400 nm, and wherein the dye-sensitized solar cell generates about 26.64 mA/cm².

* * * * *